(12) United States Patent
Stein et al.

(10) Patent No.: US 6,979,842 B2
(45) Date of Patent: Dec. 27, 2005

(54) OPTO-ELECTRONIC COMPONENT WITH RADIATION-TRANSMISSIVE ELECTRICAL CONTACT LAYER

(75) Inventors: Wilhelm Stein, Lindau (DE); Ralph Wirth, Pettendorf-Adlersberg (DE); Tony Albrecht, Bad Abbach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/749,433

(22) Filed: Dec. 31, 2003

(65) Prior Publication Data

US 2004/0256629 A1    Dec. 23, 2004

(30) Foreign Application Priority Data

Dec. 31, 2002  (DE) ............................. 102 61 675

(51) Int. Cl.⁷ ............................................. H01L 33/00
(52) U.S. Cl. ................... 257/79; 257/100; 257/103; 257/787
(58) Field of Search .................. 257/44, 100, 103, 257/79, 787

(56) References Cited

U.S. PATENT DOCUMENTS

| 5,023,199 | A |   | 6/1991  | Murakami et al. |        |
|-----------|---|---|---------|-----------------|--------|
| 5,587,609 | A | * | 12/1996 | Murakami et al. | 257/744 |
| 5,789,768 | A |   | 8/1998  | Lee et al.      |        |
| 5,889,295 | A | * | 3/1999  | Rennie et al.   | 257/96 |
| 6,169,296 | B1 | * | 1/2001 | Kamiyama et al. | 257/94 |
| 6,207,972 | B1 |   | 3/2001 | Chen et al.     |        |
| 6,255,129 | B1 | * | 7/2001 | Lin             | 438/26 |
| 6,724,013 | B2 | * | 4/2004 | Kneissl et al.  | 257/79 |

FOREIGN PATENT DOCUMENTS

| DE | 40 10 133 A1 | 10/1990 |
| JP | 01-265495    | 10/1989 |
| JP | 7-307490     | 11/1995 |
| JP | 2000-353820  | 12/2000 |
| JP | 2001-036131  | 2/2001  |
| JP | 2001-044496  | 2/2001  |
| JP | 2001-044503  | 2/2001  |
| JP | 2002-105625  | 4/2002  |
| JP | 2002-16287   | 1/2003  |
| WO | WO 01/39282  | 5/2001  |

OTHER PUBLICATIONS

Gerthsen et al., "Physik" Springer Verlag Berlin, Heidelerg, New York, vol. 14, p. 482, 1982.

* cited by examiner

*Primary Examiner*—Nathan J. Flynn
*Assistant Examiner*—Remmon R. Fordé
(74) *Attorney, Agent, or Firm*—Cohen, Pontani, Lieberman & Pavane

(57) ABSTRACT

An optoelectronic component with an epitaxial semiconductor layer sequence having an active zone that emits electromagnetic radiation, and at least one electrical contact region having at least one radiation-transmissive electrical contact layer, which contains ZnO and is electrically conductively connected to an outer semiconductor layer. The contact layer is provided with watertight material in such a way that it is substantially protected against moisture.

6 Claims, 1 Drawing Sheet

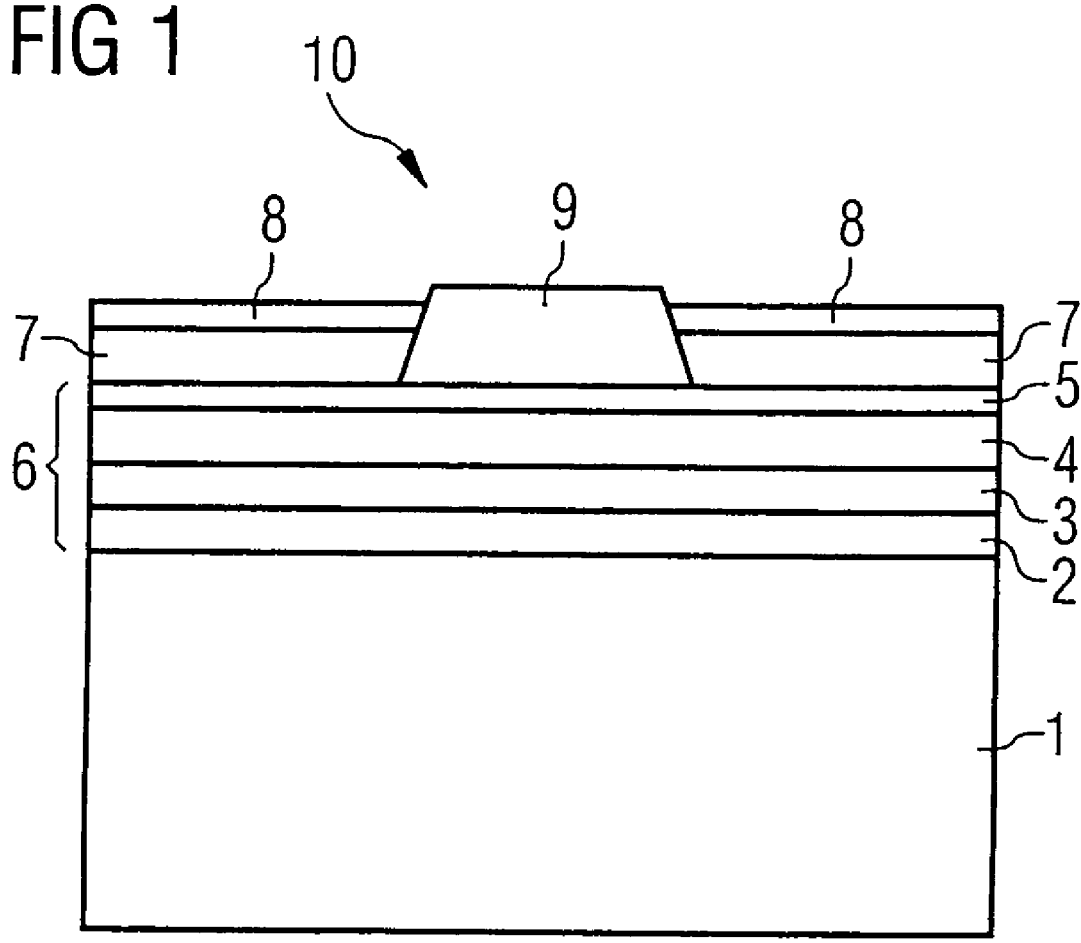

OPTO-ELECTRONIC COMPONENT WITH RADIATION-TRANSMISSIVE ELECTRICAL CONTACT LAYER

CROSS REFERENCE TO RELATED APPLICATIONS

This patent application claims the priority of German patent application 10261675.2, the disclosure content of which is hereby incorporated by reference.

This application is related to application Ser. No. 10/750,389 titled "Light Emitting Diode Chip with Radiation-Transmissive Electrical Current Expansion Layer".

FIELD OF THE INVENTION

The invention relates to an optoelectronic component with an epitaxial semiconductor layer sequence having an active zone that emits electromagnetic radiation, and an electrical contact region comprising a radiation-transmissive electrical contact layer, which contains ZnO.

BACKGROUND OF THE INVENTION

Optoelectronic components with ZnO-containing, radiation-transmissive electrical contact layers are known for example in the form of light-emitting diodes from the documents JP-2000-353820 and U.S. Pat. No. 6,207,972. In the configurations of electrical contact regions described therein, a large part of the outer areas of such contact layers is free and can thus be directly influenced externally.

SUMMARY OF THE INVENTION

It is an object of the present invention to provide an optoelectronic component of the type mentioned above in which electrical contact layers are better protected against external influences.

This and other objects are attained in accordance with one aspect of the invention directed to an optoelectronic component with an epitaxial semiconductor layer sequence having an active zone that emits electromagnetic radiation, and at least one electrical contact region having at least one radiation-transmissive electrical contact layer, which contains ZnO and is electrically conductively connected to an outer semiconductor layer. The contact layer is provided with watertight material in such a way that it is adequately protected against moisture. The term "outer semiconductor layer" is to be understood hereinafter as a semiconductor layer of a semiconductor layer sequence downstream of which, on one side, no further semiconductor layers of the epitaxially grown semiconductor layer sequence are arranged. The outer semiconductor layer can be a cladding layer, for example.

The influence of moisture may lead to significant impairment of the contact properties of the contact layer with respect to the outer semiconductor layer and is substantially avoided by the invention.

In a preferred embodiment of the optoelectronic component, watertight material is applied on free areas of the contact layer. In this respect, free areas are to be understood as areas of the contact layer on which are applied no further watertight layers, such as, for example, a bonding pad which may be situated on the contact layer or in a window of the contact layer.

Watertight material is particularly preferably applied to all the free areas of the contact layer. This means that not only the main areas of the contact layer are provided with watertight material but also in particular the side areas of the contact layer, so that the contact layer is completely encapsulated with respect to an external environment. As a result, the contact layer is also completely protected against moisture.

In an advantageous manner, the watertight material is a dielectric that is transparent to an electromagnetic radiation emitted by the optoelectronic component. This dielectric preferably comprises one or more of the substances from the group comprising $Si_xN_y$, $SiO$, $SiO_2$, $Al_2O_3$ and $SiO_xN_y$.

The refractive index of the watertight material is particularly advantageously less than the refractive index of the contact layer. In particular, the refractive index of the watertight material is adapted in such a way that reflections of the radiation emitted by the optoelectronic component at interfaces with respect to the watertight material are minimized to the greatest possible extent.

In a particularly advantageous embodiment, the electrical contact layer has a thickness corresponding to about an integer multiple of half the wavelength of a radiation emitted by the optoelectronic component. In addition, in this case the watertight material has a thickness corresponding to about a quarter of said wavelength. The choice and combination of such thicknesses reduces reflections of the emitted radiation at interfaces with respect to the contact layer and with respect to the water-repellant material of the optoelectronic component.

The thickness of the watertight material is preferably about 50 to 200 nm, including the limits of this range.

BRIEF DESCRIPTION OF THE DRAWINGS

FIG. 1, the only drawing, shows a sectional view of the preferred embodiment in a diagrammatic illustration.

DETAILED DESCRIPTION OF THE DRAWINGS

The optoelectronic component illustrated in FIG. 1 is a light-emitting diode chip comprising a substrate 1 and a semiconductor layer sequence 6. The semiconductor layer sequence 6 comprises a radiation-emitting active zone 3 arranged between a semiconductor layer 2 arranged upstream as seen from the substrate and a semiconductor layer 4 arranged downstream as seen from the substrate, and also an outer semiconductor layer 5 arranged on that side of the active zone 3 which is remote from the substrate. The semiconductor layers 2 and 4 and also the outer semiconductor layer 5 may in each case comprise an individual semiconductor layer or have a layer sequence made of a plurality of semiconductor layers.

The active zone 3 comprises, by way of example, a radiation-generating pn junction or a single or multiple quantum structure. Such structures are known to the person skilled in the art and, therefore, are not explained in greater detail at this point. A suitable multiple quantum structure is described for example in WO 01/39282 A2, the content of which is in this respect incorporated by reference.

The semiconductor layer 4 and the outer semiconductor layer 5 have a relatively high electrical sheet resistance, which is greater than 200 Ω/sq for each layer. The outer semiconductor layer 5 comprises $Al_{0.5}Ga_{0.5}As$, for example, which is doped in p-conducting fashion e.g. by means of the dopant C or Zn with the concentration of about $5-10^{18}$.

An electrical contact region 10 is applied on the surface of the outer semiconductor layer 5, and comprises an electrical contact layer 7 with a window, into which a bonding pad 9 is applied. The contact layer 7 comprises $Al_{0.02}Zn_{0.98}O$, for example, and comprises a thickness of 500 nm, for example. The bonding pad 9 comprises at least one suitable metal, for example, and is applied to the outer semiconductor layer 5 in such a way that e.g. a Schottky contact is formed with respect thereto. The potential barrier of the Schottky contact is enlarged in the event of a voltage being applied to the light-emitting diode chip in the operating direction, as a result of which a charge transport through the interface between the outer semiconductor layer 5 and the bonding pad 9 is reduced as far as possible.

The contact layer 7 may be applied by means of sputtering, for example. In order to achieve the specific properties, the contact layer must subsequently be briefly subjected to heat treatment, which may be done e.g. by means of rapid thermal annealing at a temperature of greater than or equal to 450° C.

The sheet resistance of the contact layer 7 is e.g. 16 Ω/sq, thereby ensuring that the current is injected into the light-emitting diode chip as far as possible uniformly via the entire interface between contact layer and outer semiconductor layer 5.

The contact layer 7 is covered with a layer made of watertight material 8, whereby it is protected against moisture to the greatest possible extent. The watertight material 8 comprises e.g. $SiO_2$ and is transparent to the radiation emitted by the light-emitting diode chip. As an alternative, the watertight material may advantageously have $Si_3N_4$. It has a thickness of 100 nm, for example, and may be applied e.g. by sputtering.

As an alternative to the exemplary embodiment illustrated in FIG. 1, it is possible e.g. also to cover the side edges of the contact layer 7 or further areas of the light-emitting diode chip with watertight material. In particular, it is possible to encapsulate the contact layer by means of the watertight material completely with respect to an external environment and thus also with respect to moisture. For the case where the contact layer 7 is covered with a water-permeable material, the watertight material may be applied on the latter. What is important is that the contact layer is protected against moisture to the greatest possible extent by watertight material.

In order to avoid internal reflection at interfaces, the thickness of the contact layer 7 may be adapted in such a way that it corresponds to an integer multiple of half the wavelength of the radiation emitted by the light-emitting diode chip and the thickness of the watertight material 8 may be adapted in such a way that it corresponds to about a quarter of said radiation.

As an alternative to the component illustrated in FIG. 1, the electrical contact layer 7 may be applied in continuous fashion and the bonding pad 9 may be applied on said contact layer.

Furthermore, an optoelectronic component may also have a plurality of electrical contact regions each with a contact layer or a plurality of contact layers. In such a case, it is not absolutely necessary for all the contact layers to be provided with watertight material, rather it is also possible for contact layers to remain free of said material. By way of example, this may be expedient in the case of contact layers which do not come into contact with moisture or which are protected against a water-containing environment in a different way. However, it is equally possible for all the contact layers to be covered with watertight material.

It is e.g. also possible for the contact layer to be arranged on the semiconductor layer 2 arranged upstream, between the semiconductor conductor layer 2 arranged upstream and the substrate 1 (not shown). In this case, a reflective layer, for example made of metal, is preferably applied on the contact layer between the contact layer and the substrate 1.

Such an arrangement makes it possible to achieve a significantly better electrically conductive contact between the reflective metal layer and the semiconductor layer 2 arranged upstream than if the reflective metal layer were applied directly on the semiconductor layer 2 arranged upstream. Watertight material may then preferably be applied to free side areas of the contact layer in order to protect the latter completely against an influence of moisture. This makes is possible to increase a service life of the component or reduce a degradation of the component, particularly if the component is intended for use in a moist environment.

It goes without saying that the description of the invention on the basis of the exemplary embodiments is not to be regarded as a restriction of the invention thereto. Rather, the scope of the invention encompasses all optoelectronic components which have a contact layer based on ZnO, which is in turn provided with a watertight layer. The invention encompasses any new feature and also any combination of features, which comprises in particular any combination of features in the patent claims, even if said combination is not specified explicitly in the patent claims.

We claim:

1. An optoelectronic component, comprising:
   an epitaxial semiconductor layer sequence having an active zone that emits electromagnetic radiation; and
   at least one electrical contact region having a bonding pad and at least one radiation-transmissive electrical contact layer, which contains ZnO and is electrically conductively connected to an outer semiconductor layer, wherein a surface of said contact layer which is disposed facing away from said outer semiconductor layer is completely or partially free of said bonding pad; and
   a watertight material applied to wherever said surface of the contact layer is free of said bonding pad so as to protect the contact layer from moisture.

2. The optoelectronic component according to claim 1, wherein the watertight material is a dielectric that is transparent to electromagnetic radiation emitted by the optoelectronic component.

3. The optoelectronic component according to claim 2, wherein the dielectric comprises one or more of the substances $Si_xN_y$, $SiO$, $SiO_2$, $Al_2O_3$ and $SiO_xN_y$.

4. The optoelectronic component according to claim 1, wherein a refractive index of the watertight material is less than the refractive index of the contact layer and is adapted to minimize to the greatest possible extent reflections of radiation emitted by the optoelectronic component at interfaces with respect to the watertight material.

5. The optoelectronic component according to claim 1, wherein the contact layer has a thickness corresponding to about an integer multiple of half a wavelength of radiation emitted by the optoelectronic component, and the watertight material has a thickness corresponding to about a quarter of said wavelength.

6. The optoelectronic component according to claim 1, wherein a thickness of the watertight material is about 50 to 200 nm, inclusive.

* * * * *